(12) United States Patent
Chapin et al.

(10) Patent No.: US 7,586,377 B2
(45) Date of Patent: Sep. 8, 2009

(54) REAL TIME CLOCK

(75) Inventors: Phillip Chapin, Vienna (AT); John R. Costello, Rochester Hills, MI (US); Tejas Desai, Troy, MI (US); Brian Farrell, Troy, MI (US); Douglas J. King, Lapeer, MI (US); Thomas Schaffer, Shelby Township, MI (US)

(73) Assignee: Continental Automotive Systems US, Inc., Auburn Hills, MI (US)

( * ) Notice: Subject to any disclaimer, the term of this patent is extended or adjusted under 35 U.S.C. 154(b) by 70 days.

(21) Appl. No.: 11/502,749

(22) Filed: Aug. 11, 2006

(65) Prior Publication Data

US 2007/0035353 A1  Feb. 15, 2007

Related U.S. Application Data

(60) Provisional application No. 60/708,062, filed on Aug. 12, 2005.

(51) Int. Cl.
*H03L 7/00* (2006.01)

(52) U.S. Cl. .............................. 331/2; 331/176; 331/46; 331/47; 331/49

(58) Field of Classification Search ................. 331/176, 331/46, 47, 49, 2
See application file for complete search history.

(56) References Cited

U.S. PATENT DOCUMENTS

| 4,899,117 | A  | * | 2/1990  | Vig .............................. 331/3 |
| 5,838,171 | A  |   | 11/1998 | Davis |
| 6,016,045 | A  |   | 1/2000  | Thomas et al. |
| 6,086,244 | A  |   | 7/2000  | Yin |
| 6,614,321 | B2 | * | 9/2003  | Avinoam et al. ........... 331/94.1 |
| 6,757,352 | B1 |   | 6/2004  | Kao |
| 7,212,075 | B2 | * | 5/2007  | Young et al. ................ 331/176 |

* cited by examiner

*Primary Examiner*—Arnold Kinkead

(57) ABSTRACT

A real time clock assembly includes paired crystal oscillators that experience changes in frequency responsive to temperature. The differences in frequency changes between the paired crystal oscillators are utilized to determine a temperature utilized to compensate for those shifts in frequency. The predictability of frequency responsive to temperature variations by the paired crystal oscillators is utilized for the determination of temperature.

5 Claims, 2 Drawing Sheets

REAL TIME CLOCK

CROSS REFERENCE TO RELATED APPLICATION

The application claims priority to U.S. Provisional Application No. 60/708,062 which was filed on Aug. 12, 2005.

BACKGROUND OF THE INVENTION

This invention generally relates to a method and device for determining real time within a vehicle. More particularly, this invention relates to a method and device for determining real time and temperature within a vehicle.

Many conventional electronic devices require a real time value including time and date. Current devices for keeping and determining the real time include a single relatively large microcontroller that utilizes a crystal oscillator for tracking the passage of time. The large microcontroller requires a relatively large amount of power and is susceptible to power interruptions and aging.

Further, the current devices for keeping track of time require a compensation factor due to temperature variations. The crystal oscillator vibrates or oscillates at a set frequency depending on material and cut. These oscillations vary with temperature and therefore require compensation to remain within a desired level of accuracy. Reduced variation due to temperatures can be obtained by using expensive high precision crystal oscillators. However, such high precision crystal oscillators require considerably more power as compared to a normal crystal oscillator. Many applications require a reduction in power usage to maximize battery life, therefore making the use of such high precision crystal oscillators impractical. The need for an accurate, low power, temperature compensated real time clock still exists.

SUMMARY OF THE INVENTION

An example real time clock assembly includes paired crystal oscillators that experience changes in frequency responsive to temperature. The differences in frequency changes between the paired crystal oscillators are utilized to determine temperature.

The example real time clock includes a first microcontroller and a second microcontroller each including a crystal oscillator. Each of the paired crystal oscillators oscillate at different frequencies at different temperatures. The difference in oscillation frequencies is utilized to determine a temperature.

The relationship between frequency and temperature for the pair of crystal oscillators is mapped and stored. During operation, a difference between the frequencies of the paired crystal oscillators is measured. Once a difference between the paired crystal oscillators is detected, a determination is made as to what temperature corresponds to the measured difference in frequencies. Once the temperature is determined, a correction factor is applied to compensate for any drift relating to the determine temperature.

Accordingly, the example device and method utilizes the predictability of frequency responsive to temperature variations by the paired crystal oscillators to provide the determination of temperature in order to determine the applicable correction values or factors.

These and other features of the present invention can be best understood from the following specification and drawings, the following of which is a brief description.

DETAILED DESCRIPTION OF THE PREFERRED EMBODIMENT

Figure 1:
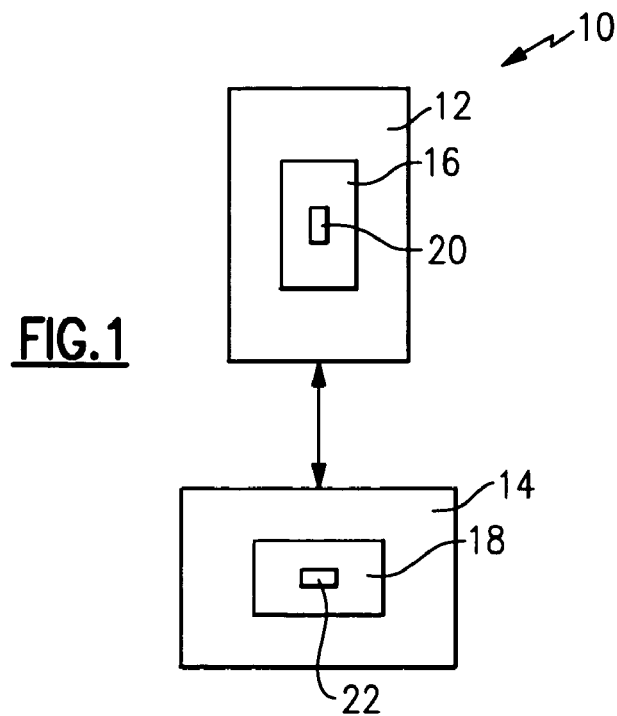
FIG. 1 is a schematic view of an example real time clock assembly.

Referring to FIG. 1, an example real time clock assembly 10 includes a first microcontroller 12 and a second microcontroller 14. The first example microcontroller 12 is a 16 bit microcontroller including 128K Flash, 4K Ram and 1K EEPROM. The second example controller 14 is a pre-processor that is in communication with the first microcontroller 12. During operation, the second controller 14 will periodically initiate actuation of the first microcontroller 12. The first microcontroller 12 remains in a sleep mode to conserve energy. The second microcontroller 14 uses much less power than the first controller 12 and therefore is operated for longer durations with less energy than the first microcontroller. The configuration of each of the first and second microcontrollers 12, 14 if by way of example, and a worker skilled in the art would understand that other microcontroller configurations are within contemplation of this invention.

The first microcontroller 12 includes a first oscillator circuit 16 and a first crystal oscillator 20. The crystal oscillator 20 vibrates at a frequency that is utilized to track time as is known. The second microcontroller 14 includes a second oscillator circuit 18 with a second crystal oscillator 22. The first and second crystal oscillators 20, 22 oscillate at different frequencies at different temperatures. The difference in oscillation frequencies is utilized to determine a temperature. The determined temperature is then utilized to apply a compensation value. The example method and assembly determines temperature without the need for a dedicated and separate temperature determination circuit.

Figure 2:
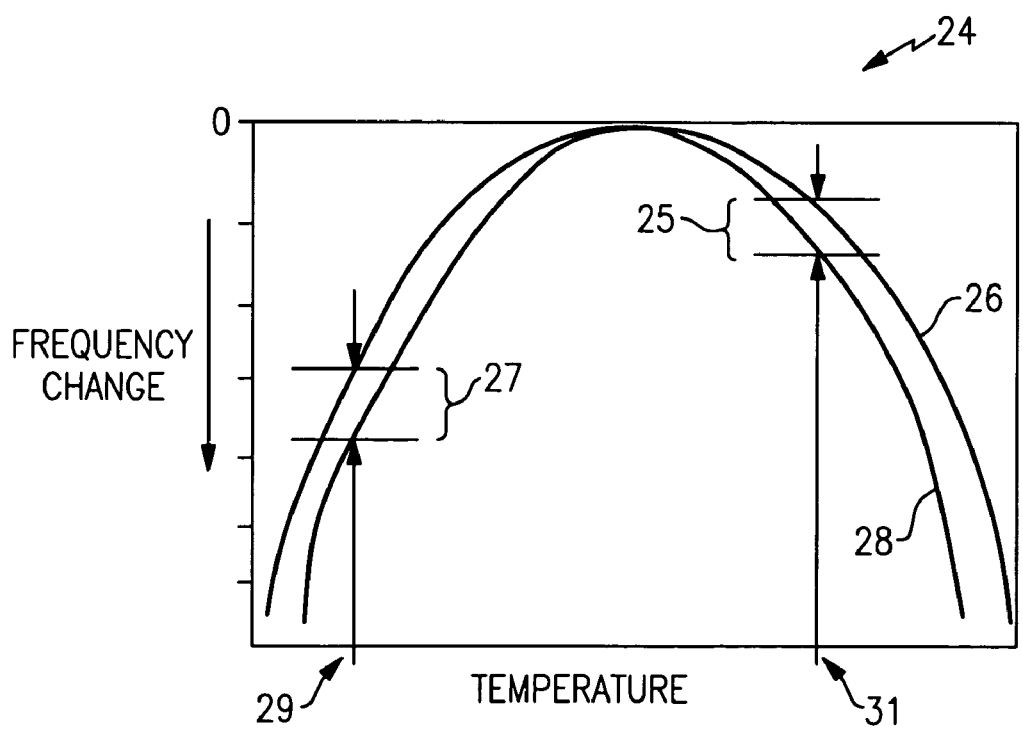
FIG. 2 is an example graph of differences in frequency related to temperature.

Referring to FIG. 2, an example relationship between frequency changes and temperature is illustrated in graph 24. In this example, the first crystal oscillator 20 deviates from a desired frequency according to the curve 26 and the second crystal oscillator 22 changes frequency according to the curve 28. The differences in frequencies as related to temperature are known for an example set of crystal oscillators. In the illustrated example, a difference 27 between the first curve 26 and the second curve 28 corresponds to a first temperature indicated at 29. A second difference 25 between the first curve 26 and the second curve 28 corresponds to a second temperature 31, different than the first temperature 29.

The difference in frequency change responsive to temperature change is recorded for a plurality of temperatures within a desired range. The differences in frequency between the first crystal oscillator 20 and the second crystal oscillator 22 therefore are paired with a temperature. These paired difference and temperature values are mapped and recorded for use in determining the temperature.

Figure 3:
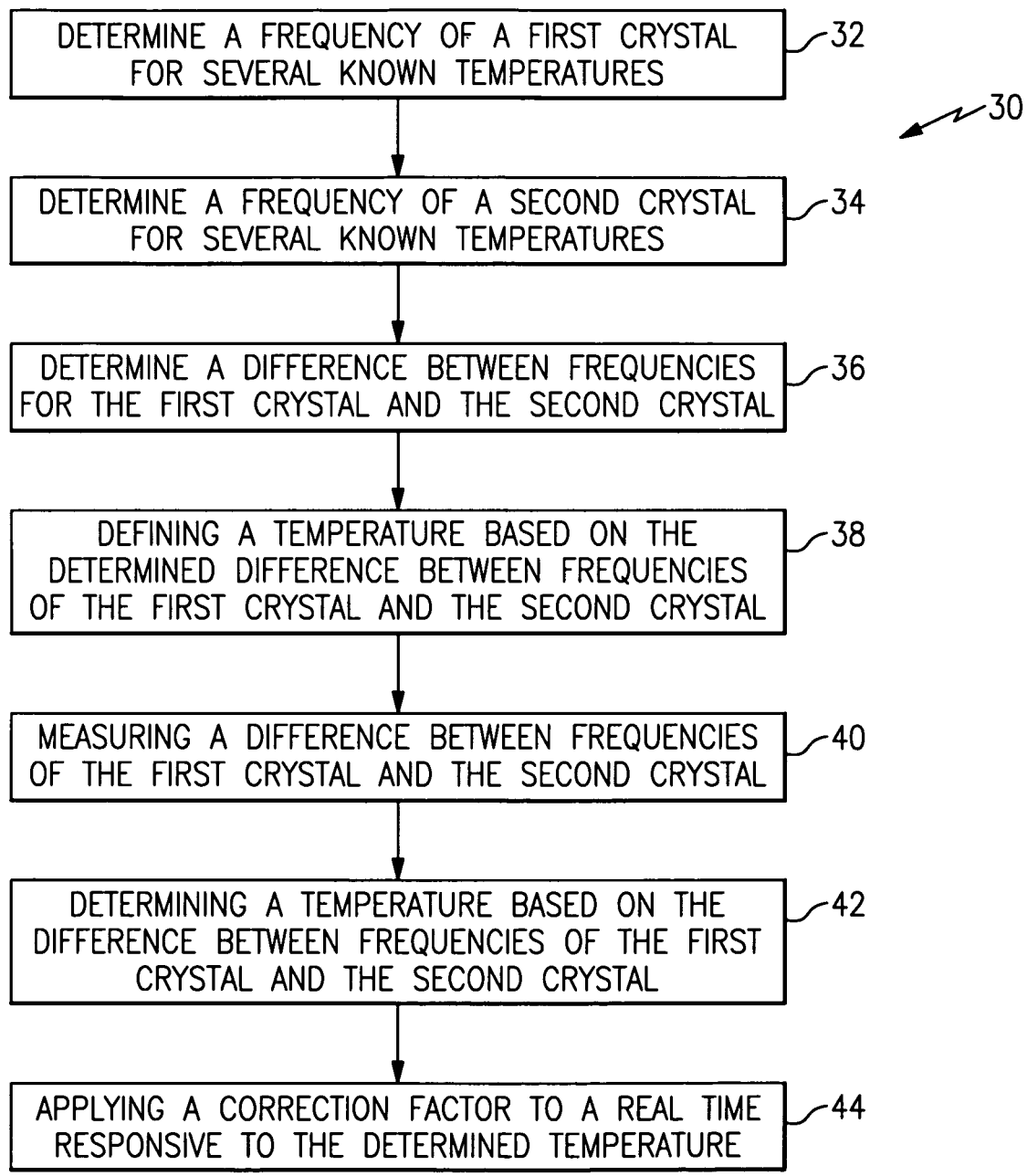
FIG. 3 is a flow diagram of example method steps for determining a temperature.

Referring to FIG. 3, a flow diagram 30 illustrates the example method and includes a first step 32 of determining a frequency, or change of frequency for the first crystal 20. A second step 34 requires determining a frequency, or change of frequency for the second crystal 22 for several temperatures or range of temperatures. Once the frequency or change in frequency for a desired temperature range is determined for each of the first crystal 20 and the second crystal 22, a difference between the change in frequency for each temperature is determined as indicated at step 36. The determined temperatures that correspond with a determined difference between frequencies for the first crystal oscillator 20 and the second crystal oscillator 22 are then utilized to define and map the temperature as is indicated by step 38. This initial calibration process can be executed for each crystal oscillator pair, or can be executed once for crystal pairs that is consistent within a desired tolerance.

Once the relationship between frequency and temperature for the pair of first and second crystal oscillators is determined and mapped, the clock assembly is ready for operation. During operation, a difference between the frequency of the first crystal oscillator 20 and the second crystal oscillator 22 is measured as is indicated by step 40. In most instances, within normal operating temperatures, the difference between frequencies will be small or non-existent. However, as the assembly 10 experiences temperatures outside of the desired operating temperature range, the difference will inevitably increase.

Once a difference between the two frequencies is detected, a determination is made as to what temperature corresponds to the measured difference in frequencies as is indicated at step 42. Once the temperature is determined, a correction factor is applied to compensate for any drift relating to the determine temperature as is indicated at step 44. The method of correcting for the shift of frequency caused by temperature is understood by one skilled in the art.

The predictability of frequency responsive to temperature variations is utilized with the differences in response by the paired crystal oscillators to provide the determination of temperature in order to determine the applicable correction values or factors.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A method of determining real time in a vehicle comprising the steps of:
    a) determining a difference between a frequency of a first crystal oscillator and a second crystal oscillator, wherein the first crystal oscillator is disposed in a first microcontroller and the second crystal oscillator is disposed in a second separate microcontroller; and
    b) determining a temperature based on the determined difference between the frequency of the first crystal oscillator and the second crystal oscillator, wherein the difference is determined by comparing an actual difference between the frequency of the first oscillator and the second oscillator to a predetermined difference.

2. The method as recited in claim 1, including the step of determining a change in frequency of the first crystal oscillator due to temperature and determining a change in frequency of the second crystal oscillator due to temperature.

3. The method as recited in claim 1, wherein one of the first microcontroller and the second microcontroller is selectively actuated to conserve energy.

4. The method as recited in claim 1, including the step of calibrating the first crystal oscillator and the second crystal oscillator for defining the predetermined difference.

5. A real time clock assembly comprising:
    a first microcontroller including a first oscillator circuit;
    a second microcontroller including a second oscillator circuit; and
    at least one of the first microcontroller and the second microcontroller provides for comparing a first frequency of the first oscillator circuit to a second frequency of the second oscillator circuit, and determining a correction factor based on a difference between the first frequency and the second frequency, wherein first microcontroller is selectively actuated to conserve energy, and the second microcontroller selectively actuates the first microcontroller at desired intervals.

* * * * *

UNITED STATES PATENT AND TRADEMARK OFFICE
CERTIFICATE OF CORRECTION

PATENT NO. : 7,586,377 B2  Page 1 of 1
APPLICATION NO. : 11/502749
DATED : September 8, 2009
INVENTOR(S) : Chapin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 98 days.

Signed and Sealed this

Fourteenth Day of September, 2010

David J. Kappos
*Director of the United States Patent and Trademark Office*